United States Patent
Martinez et al.

(10) Patent No.: US 7,288,945 B2
(45) Date of Patent: Oct. 30, 2007

(54) SYSTEMS AND METHODS FOR DETECTION OF DIELECTRIC CHANGE IN MATERIAL AND STRUCTURE

(75) Inventors: Robert E. Martinez, Austin, TX (US); Stephen A. Cerwin, Mico, TX (US); Todd H. Goyen, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 0 days.

(21) Appl. No.: 11/201,753

(22) Filed: Aug. 11, 2005

(65) Prior Publication Data

US 2006/0076985 A1    Apr. 13, 2006

Related U.S. Application Data

(60) Provisional application No. 60/602,401, filed on Aug. 18, 2004.

(51) Int. Cl.
*G01R 27/26* (2006.01)
(52) U.S. Cl. ............... 324/663; 324/672; 324/679; 324/688
(58) Field of Classification Search ............... 324/663, 324/683, 686, 688, 672, 679
See application file for complete search history.

(56) References Cited

U.S. PATENT DOCUMENTS

| | | | |
|---|---|---|---|
| 5,373,245 A * | 12/1994 | Vranish | 324/662 |
| 5,521,515 A * | 5/1996 | Campbell | 324/662 |
| 5,917,314 A | 6/1999 | Heger et al. | 324/67 |
| 6,198,271 B1 | 3/2001 | Heger et al. | 324/67 |
| 6,215,293 B1 | 4/2001 | Yim | 324/67 |
| 6,259,241 B1 | 7/2001 | Krantz | 324/67 |
| 6,446,012 B1 | 9/2002 | Macke et al. | 702/22 |
| 6,501,414 B2 | 12/2002 | Arndt et al. | 324/22 |
| 6,922,153 B2 * | 7/2005 | Pierga et al. | 324/688 |
| 2004/0008037 A1 * | 1/2004 | Chiba | 324/658 |

* cited by examiner

*Primary Examiner*—Walter Benson
*Assistant Examiner*—Timothy J Dole
(74) *Attorney, Agent, or Firm*—Fulbright & Jaworski LLP

(57) ABSTRACT

Methods and systems are described for efficiently detecting an object. The system includes at least one electrode for measuring a displacement current. The at least one electrode is coupled to a floating ground configuration provided by an op-amp, where the inverting node of the op-amp is coupled to electrode and the non-inverting node is coupled to a signal generator. The system may include a single capacitance sensor for detecting an object. Systems may include a plurality of capacitance sensors in an array configuration for detecting an object.

11 Claims, 7 Drawing Sheets

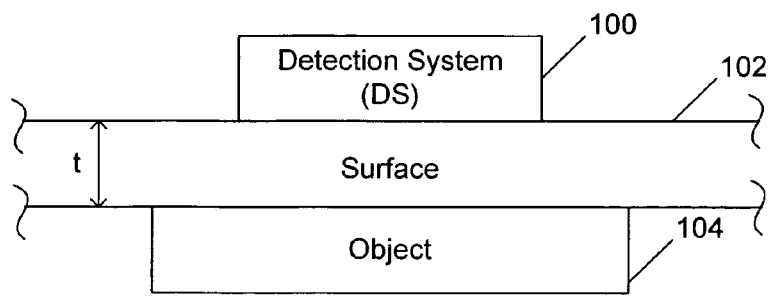
FIG. 1A
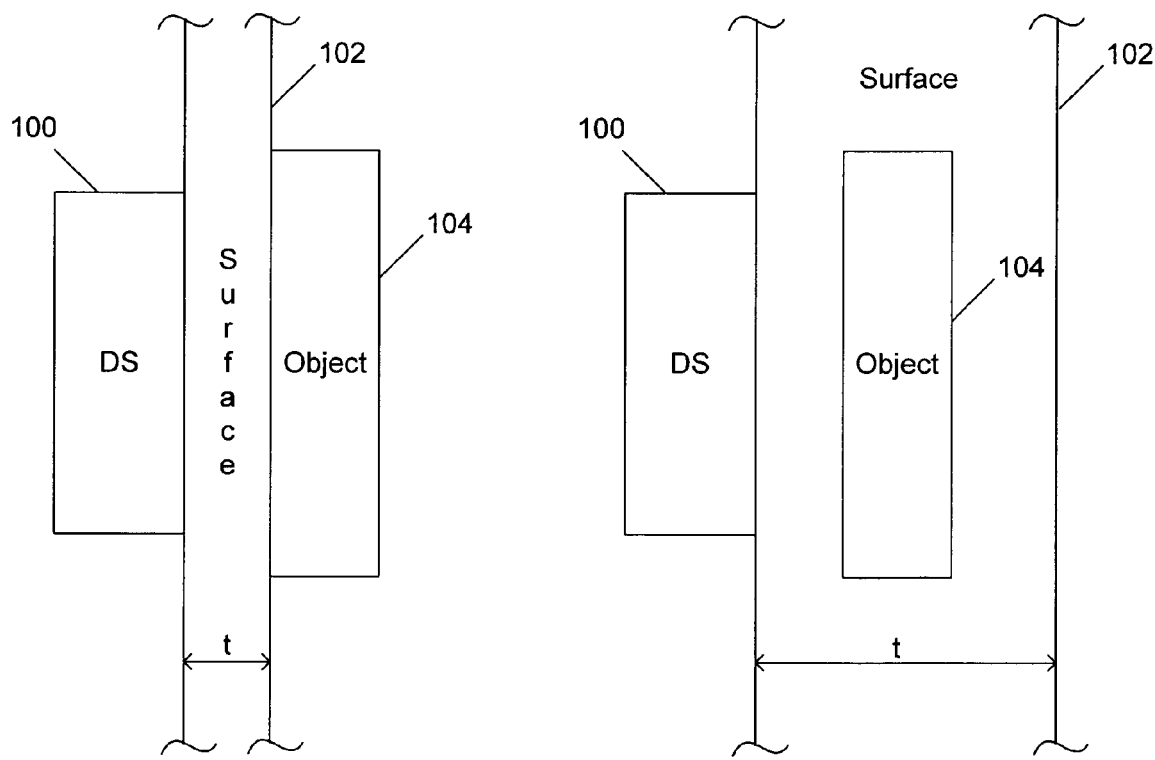
FIG. 1B
FIG. 1C

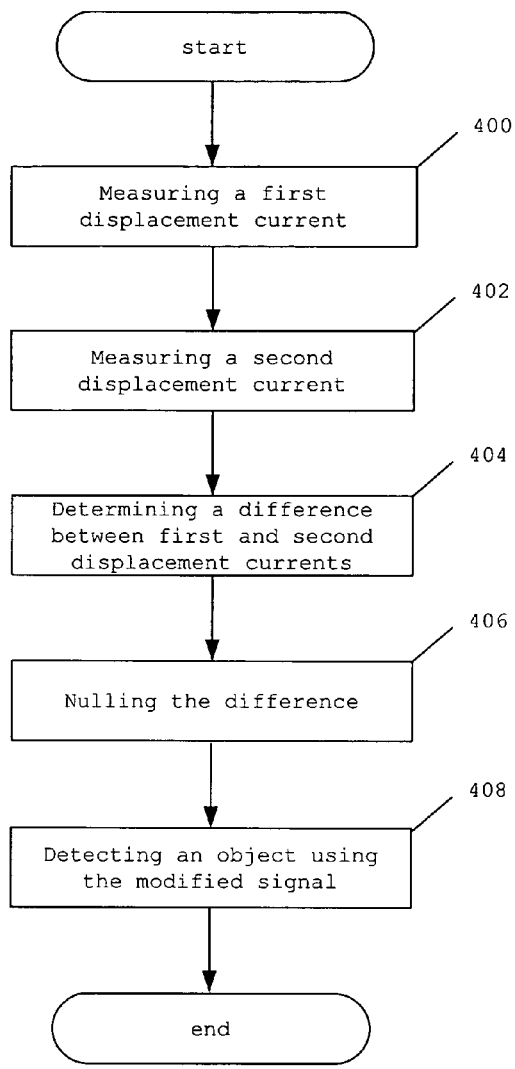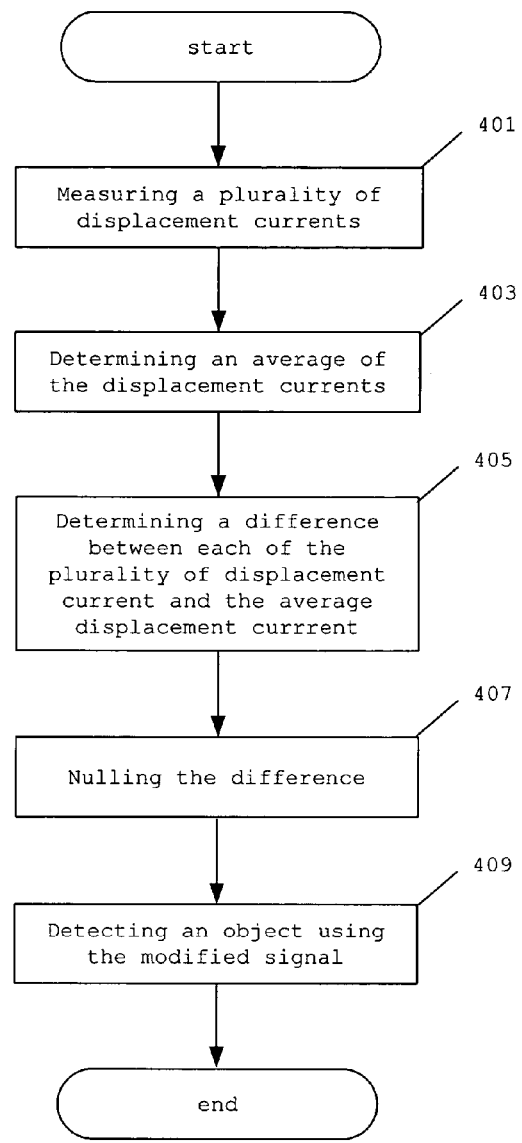
FIG. 4A
FIG. 4B

SYSTEMS AND METHODS FOR DETECTION OF DIELECTRIC CHANGE IN MATERIAL AND STRUCTURE

This application claims priority to, and incorporates by reference, U.S. Provisional Patent Application Ser. No. 60/602,401 entitled "SYSTEMS AND METHODS FOR DETECTION OF DIELECTRIC CHANGE IN MATERIAL AND STRUCTURE," which was filed on Aug. 18, 2004.

STATEMENT AS TO RIGHTS TO INVENTIONS MADE UNDER FEDERALLY-SPONSORED RESEARCH AND DEVELOPMENT

Aspects of this invention were made with government support by the Maryland Procurement Office, contract No.: MDA904-01-C-2133. Accordingly, the government may have certain rights in this invention.

BACKGROUND OF THE INVENTION

1. Field of the Invention

The present invention relates generally to detecting objects. More particularly, the present invention provides methods and systems for measuring a dielectric change on a surface for assaying and imaging hidden objects.

2. Description of Related Art

The accidental impingement on concealed objects such as pipes, fibers, and land mines carries an enormous human and/or financial cost. For example, the U.S. Department of Transportation estimates that the total property damage to pipelines, e.g., natural gas distribution pipelines, hazardous liquid pipelines, and natural gas transmission pipelines, exceeds one hundred and eighty two million dollars between 2002 and 2003. Further, dozens of injuries and fatalities were reported. Unfortunately, over half of the incidents causing the damages resulted from outside force including damages from excavation. As such, the accurate detection and imaging of pipelines can prove to be life saving and cost effective.

Another example of a need for accurate detection and imaging of concealed objects deals with land mines. There are approximately 100 million land mines in the ground worldwide, with more being added in conflict-ridden areas. The United Nation estimates over 20,000 land mine incidents occur each year. Thus, a cost-effective technology that facilitates the detection and imaging of these landmines may have a considerable impact in mitigating catastrophes to both humans and wildlife.

Previous technologies such as electromagnetic induction, infrared detection, superconducting magnetic field gradiometers, nuclear magnetic resonance imaging, and thermal neutron activation have been used to detect concealed metallic objects. However, high-pressure PVC lines are becoming more common in pipeline systems, replacing the more costly steel pipelines. Further, most land mines are made of low-metal or plastic materials. As such, besides the bulky equipment and high cost involved with the previous technologies, each of the above listed methods fail to solve the problem of accurate detection and imaging of objects, namely concealed, low metal or non-metallic objects.

SUMMARY OF THE INVENTION

In one respect, the disclosure involves a system which includes an op-amp configuration. The inverting node of the op-amp is coupled to an electrode and the non-inverting node is coupled to signal generator. As such, the electrode is indirectly driven by the op-amp. The output of the op-amp includes a buffer amplifier, which in conjunction with the electrode, are configured to detect an object. This configuration of the op-amp provides a floating ground to the electrode.

According to another aspect of the disclosure, a system including a first and second electrode configured to measure displacement current for detecting an object. The first and second electrode is coupled to a first and second floating ground circuitry, respectively. The system may also include a third electrode in proximity to the first and second electrode, where the third electrode is configured to shield the system, including the first and second electrode and the first and second floating ground circuitries from stray electric fields.

In accordance with other aspects of the disclosure, a system may be provided where the system includes a plurality of capacitance sensors, arranged in an array configuration, for measuring displacement currents and detecting an object. Each of the plurality of capacitance sensors may include a sensor electrode and each sensor electrode is coupled to a floating ground circuitry.

In other aspects of the disclosure, a system is provided where the system includes a first and second electrode, having substantially equal potential, are configured to measure displacement current for detecting an object is provided. The first and second electrode may be sensor electrodes. In some embodiments, the first electrode is a sensor electrode and the second electrode is a counter electrode. The system may also include a third electrode in proximity to the first and second electrode for shielding the system from interferences such as stray electrical fields. The system also includes a first and second ground floating ground circuitry coupled to the first and second electrode, respectively, where the first and second floating ground circuitry each include an op-amp providing a floating ground.

According to other embodiments, a system includes a plurality of capacitance sensors, where each sensor in the plurality of capacitance sensors has substantially the same potential. The plurality of capacitance sensors is configured to measure displacement currents and to detect an object. The system also includes a floating ground circuitry coupled to each sensor of the plurality of capacitance sensors, the floating ground circuitry including an op-amp providing a floating ground.

In some aspects of the disclosure, a method is provided for detecting a non-visible object. The method includes steps for measuring a displacement current using a detection circuitry. The detection circuitry includes a floating-ground configuration, a sensor electrode, a counter electrode surrounding the sensor electrode, and a guard electrode surrounding both the sensor and counter electrodes.

With regard to other aspects of the disclosure, a method for detecting an object is provided. The method includes steps for measuring a first and second displacement current.

The difference between the first and second displacement current is determined by subtracting one of the displacement currents from the other. The difference between the two displacement currents may be nullified by adjusting the phase and amplitude of first and second displacement currents. This improves the sensitivity of the circuitry and avoids being overloaded by a base signal. Variations of the difference between the two displacement currents indicate differences in local dielectric properties, which may be used to image hidden objects that are buried or located within, behind, or between walls.

With regard to yet another aspect of the disclosure, a method for detecting an object is provided. The method includes steps for determining displacement currents from each pixel of a plurality of pixels. The displacement currents are then averaged and the average current is subsequently compared to any one of the displacement currents. If a difference between the average current and a displacement current arises, the amplitude and the phase of the displacement current is modified, nulling the difference.

The use of the word "a" or "an" when used in conjunction with the term "comprising" in the claims and/or the specification may mean "one," but it is also consistent with the meaning of "one or more," "at least one," and "one or more than one." The term "coupled" is defined as connected, although not necessarily directly, and not necessarily mechanically.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention as defined in the claims, and the invention includes all such substitutions, modifications, additions and/or rearrangements.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

FIGS. 1A-1C show a configuration of a system, in accordance with embodiments of this disclosure.

FIGS. 4A and 4B show flowcharts of methods for detecting an object, in accordance with embodiments of this disclosure.

DESCRIPTION OF ILLUSTRATIVE EMBODIMENTS

Figure 2:
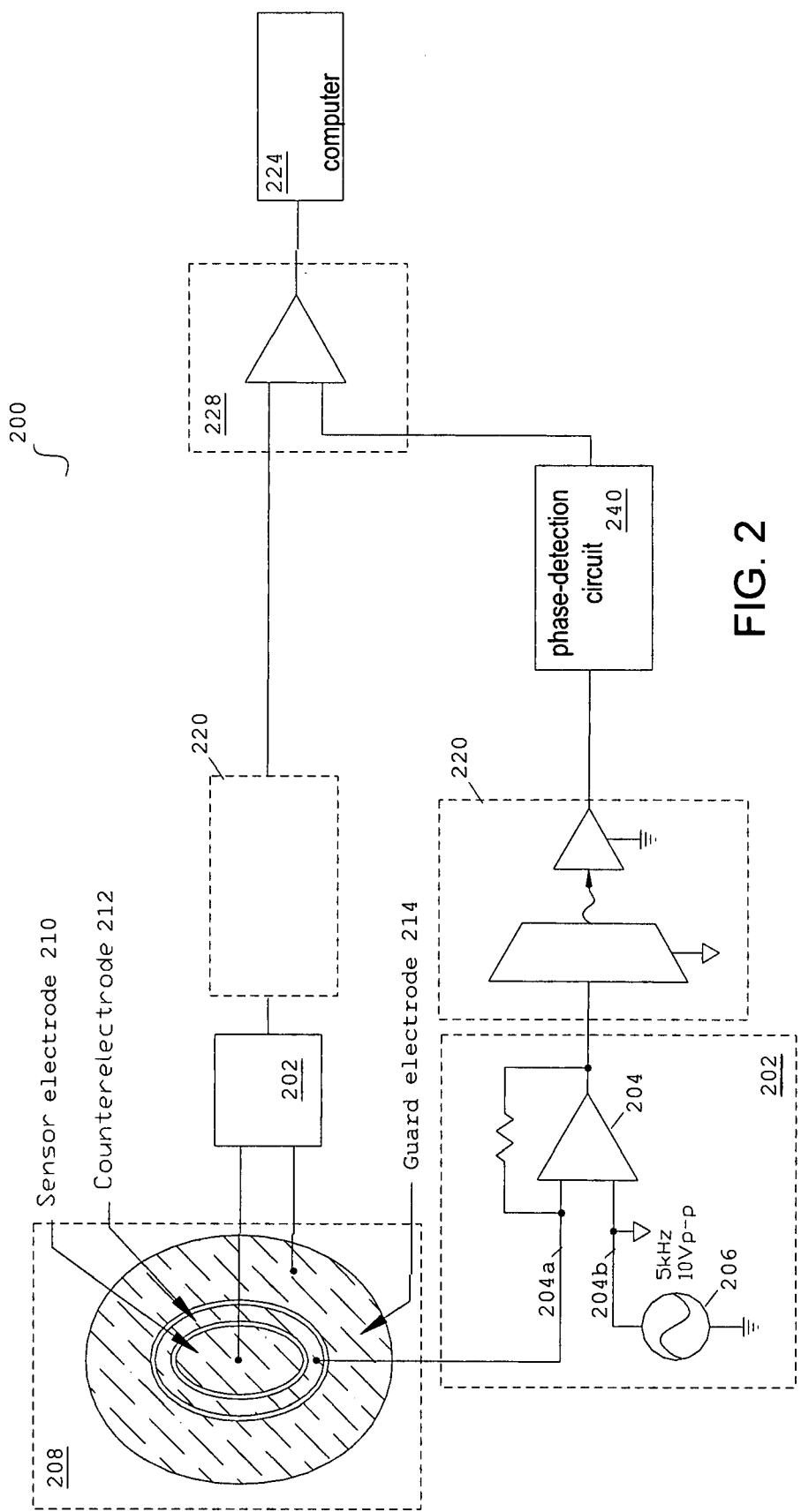
FIG. 2 shows a single element system for detecting an object, in accordance with embodiments of this disclosure.

Using a stray capacitance sensor element or an array of sensor elements provides an opportunity to detect and image objects in a more efficient and cost effective manner. Particularly, the capacitance sensor(s) may be configured to identify objects such as, but not limited to pipes, fiber optic cables, and land mines. In one embodiment, an object 104 may be located underneath, behind, or between a surface 102 of a certain thickness, t, as shown in FIGS. 1A-1C. A detection system 100, which may include at least one capacitance sensor and at least one "floating ground" circuitry may be in proximity to the surface 102 for detection of the object. In one embodiment, the detection system 100 may be directly coupled to the surface 102. Alternatively, the detection system 100 may be spaced apart from the surface (not shown).

A capacitance sensor generally measures changes in dielectric response, e.g., displacement current, at low frequency through a two-terminal capacitance measurement. An AC voltage is applied across the capacitor where a current meter measures the displacement current flowing through it. In embodiments where only one side of a surface is accessible for analysis (e.g., a wall, road surfaces, soil, etc.), a two-terminal probe may be more difficult to use. As such, embodiment of the present invention provide sensors which include a one-terminal capacitance sensing device that behaves like a two-terminal device. These sensors, e.g., capacitance sensors, may measure both the voltage and displacement current flowing.

The physics underlying the sensitivity of the detection system 100 to dielectrics is that charge must flow to an isolated conductor to change its potential from zero. The potential may be determined by a line integral of an electric field from infinity to an electrode surface. Further, more charges must be placed on the electrode if a dielectric is in proximity to the electrode because the dielectric screens the field. In electrical engineering terms, the stray capacitance of the electrode is modified in the presence of the dielectric. This effect is directly measured as a change in current flow to the electrode in the capacitance sensor.

According to embodiments of the invention, the capacitance sensor may be based on a operational amplifier (op-amp) current amplifier circuit. The inverting node of the op-amp may be connected to an electrode of the capacitance sensor, and a "T"-network may be used in the feedback via a resistor network between the output and one of the input terminals of the op-amp. The feedback mechanism may be configured to achieve a typical current-to-voltage gain of approximately $10^8$ Ohms without dramatically limiting the bandwidth of the amplifier. In one embodiment, the inverting node of the op-amp may be coupled to a sensor electrode. The non-inverting node of the op-amp may be connected to a signal generator. In this arrangement, the conventional current amplifier "ground" is actually the AC drive for the capacitance sensor. The sensor electrode may thus be indirectly driven by the op-amp. Further, the op-amp may be battery powered to isolate the op-amp from electrical interference in this "floating ground" design.

The above op-amp configuration may provide a number of advantages. First, such op-amp is a true displacement current amplifier because the feedback network may supply the necessary current to charge the sensing electrode. Very large gains can be achieved this way. Further, the sensor electrode can easily be shielded from electro magnetic (EM) interference by placing the sensing electrode in proximity to at least one guard electrode driven by a signal generator. In some embodiments, a Burr-Brown linearized opto-coupled op-amp may be used to eliminate common mode signal (with rejection in excess of 145 dB) and reference the displacement current signal to true ground.

Referring to FIG. 2, a system 200 may include "floating ground" circuitry 202. Floating ground circuitry 202 may include op-amp 204 which may include an inverting node 204a coupled to electrode 210. Op-amp 204 may also include a non-inverting node 204b coupled to a signal generator 206. Capacitance sensor 208, coupled to floating ground circuitry 202, may be configured for differential detection of local dielectric response. The capacitance sensor 208 may be coated with an insulating film, and may operate in direct contact with a surface. Alternatively, the capacitance sensor may operate in proximity to a surface.

The output of the op-amp 204 may be coupled to a buffer amplifier 220, such as a differential amplifier or an isolation amplifier with a high common mode rejection. In one embodiment, op-amp 204 and electrode 210 may measure displacement current. The displacement current may be measured with reference to a true ground using buffer amplifier 220.

In some embodiments, displacement currents may be measured at an electrode, such as a sensor electrode 210, using a "floating ground" circuitry 202 as described above. The sensor electrode 210 may be defined by removing copper from commercial printed circuit board material that may be metallized on both faces. A second electrode, such as counter electrode 212, may be in proximity to sensor electrode 210. In one embodiment, counter-electrode 212 may surround sensor electrode 210. The counter-electrode 212 may also measure displacement current, and may be driven by a second floating ground circuitry 202 as described above. These two electrodes 210 and 212 may be designed to have approximately equal areas and equal stray capacitances. Coaxial cables may be used to connect these electrodes to the respective floating ground circuitries. The coaxial shields are driven directly by the signal generator. Thus, there are no potential difference and no capacitive coupling between the electrodes 210 and 212.

A third electrode, such as guard electrode 214, may also be included in system 200, where the third electrode may be in proximity to electrodes 210 and 212. In one embodiment, electrode 214 may surround electrodes 210 and 212 on the front of the capacitance sensor 208 and may also be larger than electrodes 210 and 212. Electrode 214 may be driven by a signal generator, such as signal generator 206 in the floating ground circuitry 202. The third electrode 214 may provide shielding from stray electric fields to electrodes 210 and 212. Further, since the guard electrode 214 may be driven by signal generator 206, which is coupled to both electrode 210 and 212, the electrodes 210, 212, and 214 are equipotential.

Signals from floating ground circuitry 202 may measure current from the sensor electrode 210 and counter-electrode 212 and may provide these signals to circuitry 228 that may be designed to subtract the two signals. The computational unit 228 may be calibrated while the system 200 is in contact with a surface to produce a null output. The differential signal may be measured by using a dual-channel lock-in amplifier. In one embodiment, the capacitance sensor 208 may scan in a raster pattern, and changes in the output from the lock-in amplifier may be recorded on computer 224. The data may be displayed as an image, and subsequent digital processing, such as extracting the phase from a displacement current signal via phase detection circuit 240, may be done as necessary.

Referring to FIG. 4A, a flow chart for detecting an object is presented. Upon placing a system, such as system 200, in proximity to or coupled to a surface, a first displacement current may be measured (step 400). A second displacement current may also be measured (step 402). In one embodiment two electrodes such as a sensor and a counter electrode, each coupled to a floating ground circuitry, may be configured to detect and measure the first and second displacement current. Next, the difference between the first and second displacement current may be determined (step 404). In one embodiment, a computational circuitry may be used to subtract one displacement current from the other (e.g., subtracting the second from the first displacement current or vice versa). Any difference found may be nullified (step 406) to improve sensitivity and avoid being overloaded by a base signal. In one embodiment, to null the difference a phase and the amplitude of each displacement current may be adjusted by a phase detection and adjustment circuitry. The modified difference signal will vary when the sensor is near materials with different dielectric properties, indicating the presence of an object or objects hidden behind, between, or underneath a surface (step 408). In other embodiments, variations in displacement current may be subtracted from those currents of a fixed reference capacitor (or vice versa), and variations in this difference may be used to detect the presence of hidden objects. In each of the above embodiments, the sensor system may be scanned in a raster pattern, and changes to the modified difference signal may be monitored by a phase-sensitive amplifier, such as a lock-in amplifier, and recorded on a computer.

In some embodiments, an array of sensitive electrometer elements, e.g., more than one capacitance sensor, each configured to measure displacement current with a current sensitivity below one pico ampere, may be implemented. An "array," as described herein, may include any grouping or arrangement of the sensitive electrometer elements. In one embodiment, an array may be a linear arrangement of the elements. Alternatively, an array may be a 2 dimensional grouping having columns and rows. In another embodiment, an array may include a random arrangement of the elements. A "pixel," as described herein, may include a capacitance sensor which may comprise at least one electrode.

The array of sensitive electrometer elements may be driven at relatively low frequency (from approximately 1 Hz) to allow deep penetration into a surface (e.g., soil, wall, concrete barrier, etc). Both the amplitude and phase of the detected displacement current may be extracted at each pixel to aid in the discrimination of material properties. By configuring the electrodes in an array, it can be possible to image and interpret the topography of objects located behind, between, or underneath a surface. Real-time image processing may also be implemented, as necessary, to reduce clutter in the image and assist the operator in interpreting data generated by the device.

Figure 3A:
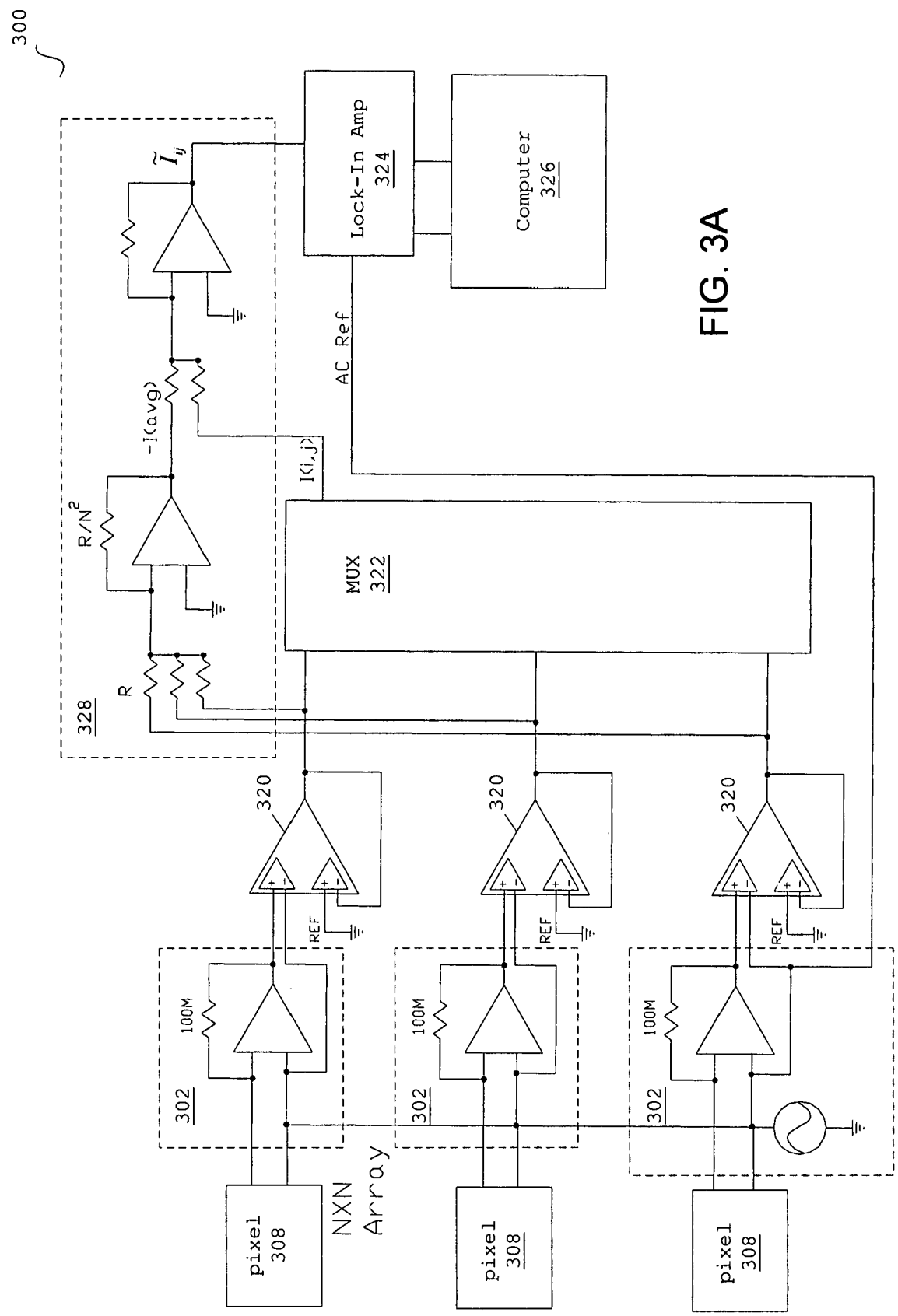
FIGS. 3A and 3B show a system including an array of sensitive electrometers for detecting an object, in accordance with embodiments of this disclosure.

Referring to FIG. 3A, a schematic of a system 300 including a plurality of sensitive electrometer elements is shown. As described above, the "floating ground" circuitry for measuring displacement current may work like a classic current to voltage amplifier and relies on a modification to achieve two-terminal functionality from one electrode: each amplifier's "ground" floats on the AC bias of the device. System 300 may be designed with floating ground circuitries 302 at each pixel 308. Each floating ground circuitry 302 may include a higher bandwidth field-effect transistor (FET) device, such as a high bandwidth op-amp, to achieve higher differential capacitance sensitivity. In order to achieve a true ground circuit at the output of the op-amp, at least one amplifier 320, such as a high-bandwidth differential receiver or an isolation amplifier, may be coupled to the output of the op-amp for each pixel.

Figure 3B:
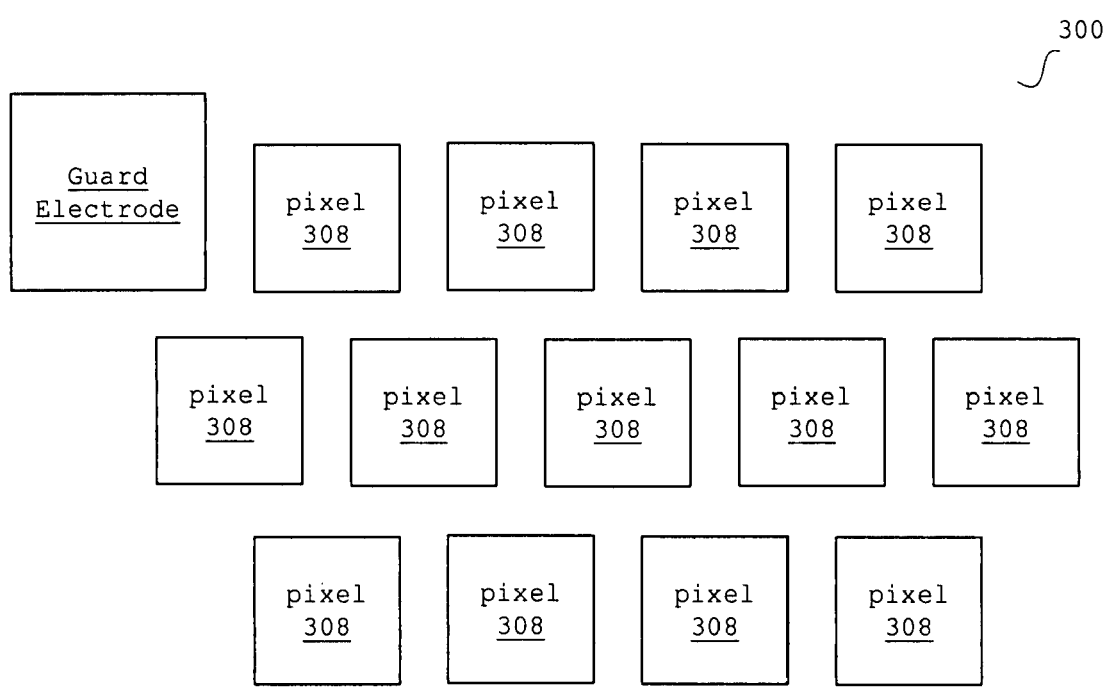

System 300 may also include at least one guard electrode in proximity to the pixels 308, as seen in FIG. 3B. Alternatively, the ground electrode may surround the array of pixels. In one embodiment, the guard electrode may provide a shield for the pixels from stray electric fields. Further, the guard electrode may be configured to provide a shield from other interferences to the system, such as shielding the floating ground circuitries 302 coupled to each pixel.

In one embodiment, the capacitance sensors 308 may be operated in a differential manner to avoid being overloaded by a base signal. In a single pixel array (e.g., system 200 of FIG. 2), the displacement current difference between a sensor electrode and a counter-electrode may be measured, and the phase and amplitude balance of these signals to null the difference on a nominal surface may be adjusted. Dielectric inhomogeneities manifest themselves as localized variations from this null. In the array system (e.g., system 300 of FIGS. 3A and 3B), the differential operation may be preformed by collecting a real-time average displacement current signal from the entire array. For example, let $I_{ij}$ denote the displacement current from pixel (i,j), referenced to true circuit ground. This may be a time-varying signal, oscillating at the drive frequency $\omega=2\pi f$. The average for an N×N array may be $$I_{average} = \frac{1}{N^2} \sum_{i,j} I_{ij}$$ Eq. 1

The real-time displacement current signal $I_{ij}$ from each pixel may be selected in turn by a multiplexer 322 and the array average may be calculated via computational unit 328. Alternatively, the displacement current signal from each signal may be selected from a set of multiplexers. The array average may next be subtracted from each pixel ($\tilde{I}_{ij}=I_{ij}-I_{average}$) via a computation unit 328. It is noted that circuitry shown in FIG. 3A represents an illustrative embodiment. Other circuitry can also be used to compute $I_{ij}$, $I_{average}$, and $\tilde{I}_{ij}$ as known in the art. In some embodiments, a capacitance reference standard may be provided and a voltage proportional to the displacement current through the capacitance reference may be subtracted from the displacement current signal at each pixel. The signal, $\tilde{I}_{ij}$, may be provided to a phase detection amplifier, such as a two-phase lock-in amplifier 324, to extract amplitude and phase, and then to computer 326 for further digital processing and display via a monitor, a printer, a television set, etc.

Alternatively, according to some embodiments, the signal from each pixel in the array may be provided to a circuitry that automatically varies the amplitude and the phase of the signal. For example, the variation in amplitude and phase may be achieved by control signals sent to an amplitude- and phase-shifting circuitry. A signal from a capacitance reference standard or a signal derived from the array-average displacement current may be subtracted from this amplitude- and phase-shifted signal, forming an error signal. The error signal may be provided to a pair of phase-sensitive amplifiers, such as a two-phase lock-in amplifier, and a pair of error integrators. Output signals from the error integrators may provide the control signals sent to the amplitude- and phase-shifting circuitry, to maintain a "null" error signal at the phase-sensitive amplifier input. The control signals may provide a measure of the dielectric response of each pixel, and variations in these signals may be used to generate stray capacitance images In one embodiment, system 300 may include a 2-dimensional, N×N array to optimize phase detection and current sensitivity in each pixel, signal drive isolation, and background subtraction to "null" the detector array and minimize extraneous effects from ground-detector spacing variation ("lift-off" effect). Further, system 300 may maximize the AC drive bandwidth and may use it to investigate the effect of varying drive frequency for either enhanced material specificity or depth resolution. Further, the system may be interfaced with a real-time display, such as, but not limited to a PDA and/or the Internet.

In other embodiments, system 300 may optimize detection by using an autoranging technique. In particular, upon receiving a signal, system 300 may determine the voltage of the signal. Background subtraction to "null" the received signal may be performed by setting a sensitivity level of a reference signal to a voltage slightly higher than the voltage of the received signal. Alternatively, the sensitivity of the reference signal may be set to a voltage slightly lower than the voltage of the received signal. The difference in the voltages may be determined. The difference between the voltages may subsequently amplified, achieving higher gain and a high level of sensitivity.

Referring to FIG. 4B, a flow chart for detecting an object is presented. A system, such as system 300 of FIGS. 3A and 3B, may be placed in proximity or directly coupled to a surface. A plurality of pixels, each pixel including a sensor electrode coupled to a floating ground circuitry, may be configured to measure displacement currents (step 401). An average of the displacement currents may be determined (step 403). In one embodiment, the plurality of displacement currents may be provided to a computational unit where the computational unit may be configured to determine the average.

Next, a difference between each of the plurality of displacement currents and the average current may be determined (step 405). In some embodiments, the plurality of displacement currents may be provided to a multiplexer (MUX), where the MUX selects one displacement current from the plurality of displacement currents and provides that one displacement current to a computational unit for determining the difference. Alternatively, a plurality of MUXs may be provided where the plurality of displacement currents are divided into portions and each portion may comprise a MUX. Upon the step of determining the difference, one displacement current from the plurality of MUXs may be selected. Determining the difference between plurality of displacement currents and the average may be done sequentially (e.g., each displacement current is fed sequentially to the computational unit for determining a difference). Alternatively, the step of determining a difference may be done in parallel, where the average current is provided to a plurality of computational units and a single displacement current may be provided to each unit in the plurality of computational units.

Upon determining a difference between an average current and a displacement current, the difference may be nullified (step 407) to improve the sensitivity of the system and avoid being overloaded by a base signal. In one embodiment, the difference may be provided to a phase detection circuitry, where the phase detection circuitry may be configured to adjust the phase and amplitude of the displacement current, nullifying any difference. The modified displacement current may subsequently be amplified by, for example, a phase-sensitive amplifier such as a lock-in amplifier, processed, and an image of an object located behind, underneath, or between a surface may be produced by a computer.

EXAMPLES

The following example is included to demonstrate specific embodiments of this disclosure. It should be appreciated by those of skill in the art that the techniques disclosed in the example that follows represent techniques discovered by the inventors to function in the practice of the invention, and thus can be considered to constitute specific modes for its practice. However, those of skill in the art should, in light of the present disclosure, appreciate that many changes can be made in the specific embodiments which are disclosed and still obtain a like or similar result without departing from the scope of the invention.

Example 1

Detection of Optical Fibers

Figure 5:
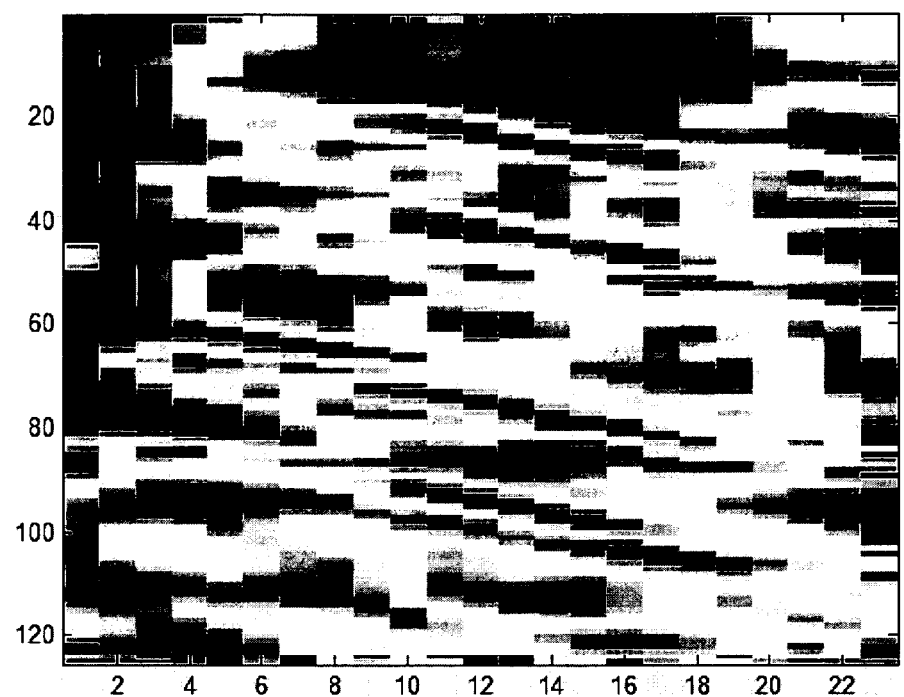
FIG. 5 shows an image of three optical fibers buried between a wallboard using dielectric measurement techniques, in accordance with embodiments of this disclosure.

The phase of the displacement current may contain vital information about the nature of the dielectric material of an object. As illustrated below with reference to FIGS. 5-7, the phase of the signal may also be less sensitive to clutter than the amplitude. Thus, the electronic components of a system, such as system 300, may be selected with high bandwidth to minimize phase errors.

Three optical fibers, with diameters 0.039", 0.064", and 0.028", respectively, were buried in the surface of a ¼ inch thick gypsum wallboard opposite of the side scanned with the dielectric detector system. The fibers were detected as shown in the image provided in FIG. 5. Because of the detector point spread function, each fiber appears as three bright lines above the dark blue background in the image. The additional, faint linear features at the upper and lower right are most likely the images of seams where the gypsum material was removed temporarily to accommodate the fibers.

Figure 6:
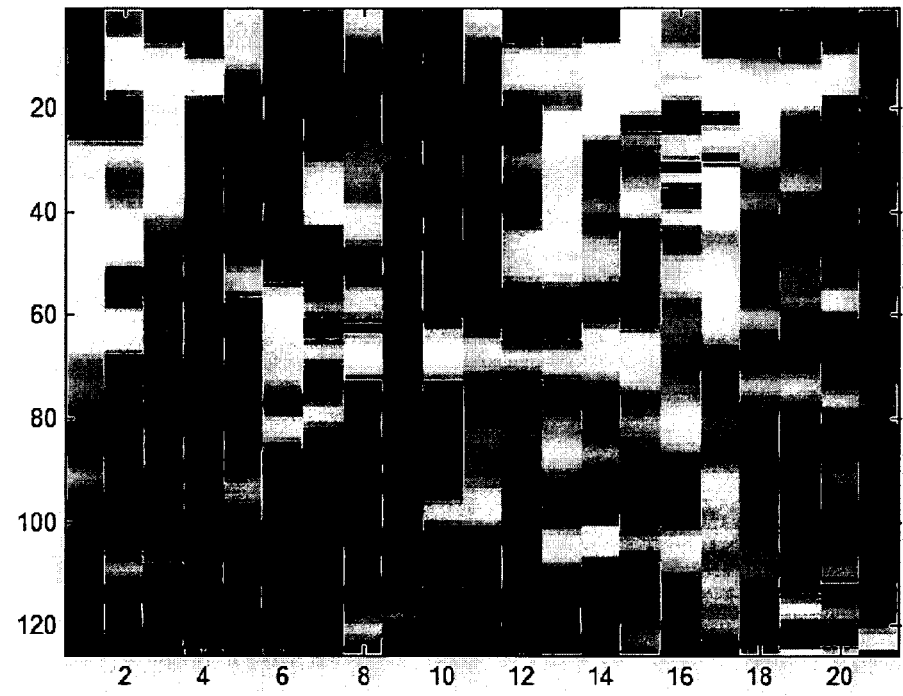
FIG. 6 shows an image of a fiber displaced behind a wallboard using dielectric measurement techniques, in accordance with embodiments of this disclosure.
Figure 7:
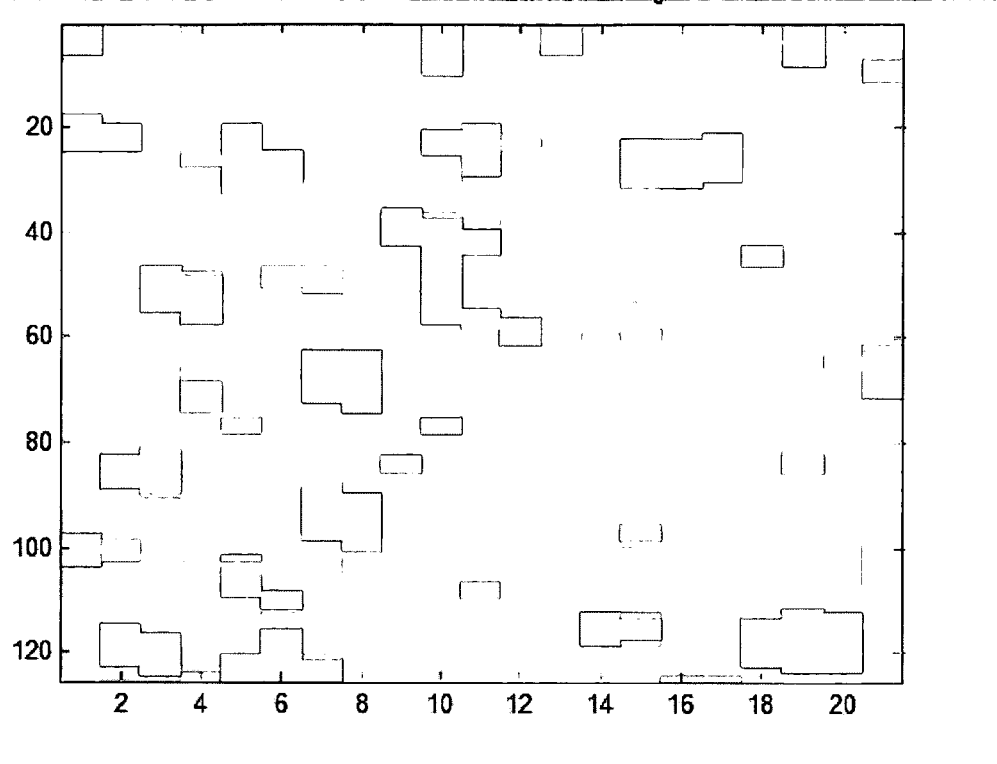
FIG. 7 shows a phase image of the fiber in FIG. 6, in accordance with embodiments of this disclosure.

In another example, a 0.188" diameter fiber displaced about 1 cm from the 0.25" thick wall board is shown FIG. 6 and in the phase image shown in FIG. 7. The phase images are calculated as $\tan^{-1}(\text{CHANNEL\_2}/\text{CHANNEL\_1})$ versus real-space position on the wall. CHANNEL_1 and CHANNEL_2 are signals from the x and y output channels of the lock-in amplifier, respectively. This pair of images was taken with the fiber in proximity to the same wall (with buried fibers) used in FIG. 5. The dominant feature of FIG. 7 is the phase image (bright pink band) of the 0.188" diameter fiber. However, the phase features from the much smaller buried fibers also appear in this image as faint horizontal streaks.

The images acquired in this example allow for interpretation of elongated features that would be representative of buried objects such as pipes and cables. In particular, the phase images may be of particular utility because they appear to be less sensitive to clutter.

This technique was sensitive. The detector system operated using a 5 Khz had a displacement current sensitivity of about 0.5 pA. The detector system was also capable of measuring stray capacitance variations on the order of 3 attofarads ($3\times10^{-18}$ F), a value similar to that achieved in state-of-the-art quantized charge transport experiments, performed in carefully shielded environments.

Using modern components such as high bandwidth op-amps and differential receivers, it should be possible to operate the device at frequencies up to 1 MHz or higher. With the same current resolution (~1 picoampere) in each pixel, the system may be able to detect capacitance variations on the order of $10^{-20}$ F. To put this sensitivity in perspective, imagine a simple model of the array as a "pixilated" parallel plate capacitor with elements having area A=10 cm², assuming a sampling depth of approximately 1 m, i.e., the parallel plate capacitors (with dielectric between them) are separated by 1 meter. The minimum detectable volume V for a dielectric inhomogeneity $\delta\kappa/\kappa$ is given by $$V(\delta\kappa/\kappa)=Ad(\delta I/I) \quad \text{Eq. 2}$$

With a current resolution $\delta I/I \sim 10^{-8}$, a 1% dielectric inhomogeneity ($\delta\kappa/\kappa \sim 0.01$) as small as 1 mm³ should be detectable in each pixel.

With the benefit of the present disclosure, those having skill in the art will comprehend that techniques claimed herein may be modified and applied to a number of additional, different applications, achieving the same or a similar result. The claims cover all such modifications that fall within the scope and spirit of this disclosure.

REFERENCES

Each of the following references is hereby incorporated by reference in its entirety:
U.S. Pat. No. 5.917,314
U.S. Pat. No. 6,198,271
U.S. Pat. No. 6,215,293
U.S. Pat. No. 6,259,241
U.S. Pat. No. 6,446,012
U.S. Pat. No. 6,501,414

The invention claimed is:

1. A system comprising:
a sensor electrode;
a signal generator;
a first op-amp comprising: a first inverting node coupled to the sensor electrode and a first non-inverting node coupled to the signal generator, where the sensor electrode is indirectly driven by the first op-amp and where the first op-amp provides a floating ground to the sensor electrode;
a counter-electrode in proximity to the sensor electrode;
a second op-amp comprising a second inverting node coupled to the counter-electrode and a second non-inverting node coupled to the signal generator, where the counter-electrode is indirectly driven by the second op-amp and where the second op-amp provides another floating ground to the counter-electrode; and
a third op-amp comprising a third inverting node coupled to the output of the first op-amp and a third non-inverting node coupled to the output of the second op-amp, the third op-amp providing a differential signal between the sensor electrode and the counter-electrode.

2. The system of claim 1, further comprising:
a guard electrode coupled to the signal generator and to the second non-inverting node of the second op-amp, the guard electrode providing shielding from stray electric fields to the sensor electrode and the counter-electrode.

3. The system of claim 2, where the guard electrode surrounds the counter-electrode.

4. The system of claim 1, the signal generator operating above 1 Hz.

5. The system of claim 1, the signal generator operating at a peak-to-peak amplitude of about less than or equal to 50 volts.

6. The system of claim 1, the signal generator providing a continuous AC signal.

7. The system of claim 1, further comprising a feedback connection between an output of the first op-amp and the first inverting node.

8. The system of claim 7, the feedback connection comprising a resistor network configured for achieving a current-to-voltage gain of approximately $10^8$ Ohms.

9. The system of claim 1, further comprising a buffer amplifier coupled to the output of the first op-amp.

10. The system of claim 9, the buffer amplifier comprising a differential amplifier for subtracting an AC drive from the output of the first op-amp.

11. The system of claim 1,
where the counter-electrode surrounds the sensor electrode.

* * * * *